United States Patent [19]

Ito et al.

[11] 4,343,657

[45] Aug. 10, 1982

[54] PROCESS FOR PRODUCING A SEMICONDUCTOR DEVICE

[75] Inventors: Takashi Ito, Kawasaki; Hajime Ishikawa, Yokohama; Masaichi Shinoda, Sagamihara, all of Japan

[73] Assignee: Fujitsu Limited, Kawasaki, Japan

[21] Appl. No.: 174,134

[22] Filed: Jul. 31, 1980

[30] Foreign Application Priority Data

Jul. 31, 1979 [JP] Japan ................... 54-97659

[51] Int. Cl.³ ............................. H01L 21/22
[52] U.S. Cl. ....................... 148/1.5; 29/571; 148/187; 357/23; 357/91
[58] Field of Search .................. 148/1.5, 187; 357/91, 357/23 VT; 29/571

[56] References Cited

U.S. PATENT DOCUMENTS

| | | | |
|---|---|---|---|
| 3,657,030 | 4/1972 | Porter | 148/187 |
| 3,793,090 | 2/1974 | Barile et al. | 148/187 |
| 3,841,918 | 10/1974 | Agraz-Guerena et al. | 148/1.5 |
| 3,867,196 | 2/1975 | Richman | 148/187 |
| 4,105,805 | 8/1978 | Glendinning et al. | 29/576 B |
| 4,113,515 | 9/1978 | Kooi et al. | 148/1.5 |
| 4,136,434 | 1/1979 | Thibault et al. | 29/571 |
| 4,158,717 | 6/1979 | Nelson | 148/187 |
| 4,217,153 | 8/1980 | Fukunaga | 148/1.5 |
| 4,257,832 | 3/1981 | Schwabe et al. | 148/1.5 |
| 4,264,376 | 4/1981 | Yatsuda et al. | 148/187 |

FOREIGN PATENT DOCUMENTS

| | | |
|---|---|---|
| 6706 | 1/1980 | European Pat. Off. . |
| 1621522 | 7/1970 | Fed. Rep. of Germany . |
| 1644012 | 9/1970 | Fed. Rep. of Germany . |
| 2623009 | 12/1976 | Fed. Rep. of Germany . |
| 2921010 | 11/1979 | Fed. Rep. of Germany . |
| 2922014 | 12/1979 | Fed. Rep. of Germany . |
| 2313770 | 12/1976 | France . |
| 2021863 | 12/1979 | United Kingdom . |

OTHER PUBLICATIONS

Maguire Electronics 39(1966) pp. 156-162.

*Primary Examiner*—Arthur P. Demers
*Attorney, Agent, or Firm*—Staas & Halsey

[57] ABSTRACT

In the production of a semiconductor device including an MISFET or a one transistor-one capacitor-memory cell, the excellent oxidation resistance of a silicon nitride film formed by direct nitridation, as well as the great oxidation tendency of a covering layer made of, for example, polycrystalline silicon selectively formed on the silicon nitride film, are utilized so as to form various regions of the semiconductor device in self alignment and to prevent a short circuit between such regions.

A process according to the present invention comprises the steps of: selectively covering a semiconductor substrate with a relatively thick field insulation film; forming, on the exposed part of the semiconductor substrate, a relatively thin nitride film by direct nitridation; and selectively forming a film of silicon or a metal silicide on the silicon nitride film. A capacitor made of the silicon nitride is formed between the silicon or silicide film and the semiconductor substrate. The capacitor may be one for storing information.

27 Claims, 29 Drawing Figures

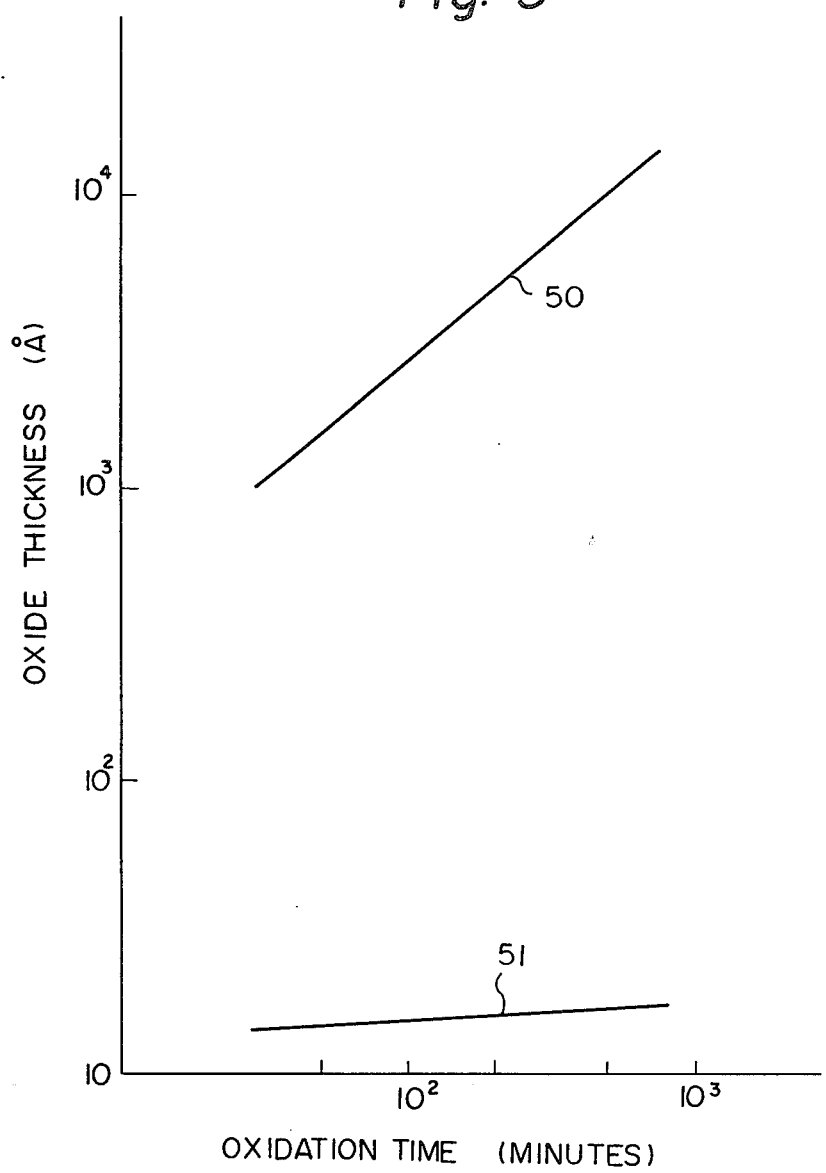

PROCESS FOR PRODUCING A SEMICONDUCTOR DEVICE

BACKGROUND OF THE INVENTION

1. Field of the Invention

The present invention relates to a process for producing a semiconductor device having field effect transistors (FETs).

2. Description of the Prior Art

The conventional process for producing an FET will first be explained with reference to FIG. 1, wherein a standard structure for a metal-insulator-semiconductor FET (MISFET) device or a metal-oxide-semiconductor FET (MOSFET) device is illustrated. In FIG. 1, the MOSFET comprises a silicon body or substrate 1. The silicon substrate 1 has a P type conductivity when the MOSFET is an N channel transistor. A field oxide film 2 is formed on the silicon substrate 1 and surrounds the substrate surface where the source, drain and gate regions are to be formed. A gate oxide film 3 is formed on the silicon substrate 1 and a polycrystalline silicon gate 4 is formed on the gate oxide film 3. N+ type source and drain regions 5 and 6, respectively, are exposed within windows 8 and 9 of a phosphosilicate glass (PSG) film 7. Contact electrodes 10 and 11 are brought into ohmic contact with the source region 5 and drain region 6, respectively, via the windows 8 and 9.

In the formation of the MOSFET, the source region 5 and the drain region 6 are usually produced by the ion implantation of impurities using the polycrystalline silicon gate 4 as a mask. After the formation of the source and drain regions, the windows 8 and 9 are formed through the PSG film 7 so as to expose surface portions of these regions. This means that, since a mask used in the photolithographic process of the window formation may be misaligned with the theoretical position of the windows, the dimensions of the source and drain regions 5 and 6, respectively, must be large enough to ensure exposure of such surface portions. The width ($W_2$) of the PSG film 7 covering the polycrystalline silicon gate 4 and the source or drain region, and the width ($W_4$) of the PSG film 7 covering the field oxide film are approximately from 2 to 3 microns. The width ($W_3$) of the exposed source or drain portion is approximately 3 microns and the width ($W_1$) of the gate oxide film 3 is approximately 3 microns.

The MOSFETs produced by the conventional process as illustrated above have disadvantageously large dimensions due to the widths ($W_2$, $W_3$ and $W_4$). It is to be noted in this regard that, although the width ($W_1$) of the gate oxide film 3 is important for determining the electrical characteristics of the MOSFETs, the widths ($W_2$, $W_3$ and $W_4$) do not influence the electrical characteristics, but merely influence the alignment procedure of the photolithographic mask for the formation of the windows 8 and 9.

In FIG. 2, a semiconductor memory device including an MOSFET is illustrated. In FIG. 2 the same members as those in FIG. 1 have the same reference numerals. Reference numerals 12, 24 and 25 indicate an oxide film of a capacitor, a capacitor gate and a protecting oxide film of a capacitance element of the semiconductor memory device, respectively. Since both oxide films 3 and 25 are formed simultaneously by oxidation of silicon, the thickness of the relatively thick oxide film 25 is not so great as to prevent a short circuit between the polycrystalline silicon gate 4 and the capacitor gate 24 via the oxide film 25.

Referring again to FIG. 1, in order to enhance the electrical characteristics of the MOSFET, the dimensions of the elements of the MOSFET, particularly the channel length, i.e. the width ($W_1$), should be reduced. When such dimensions are small, the parasitic capacitance of the various elements of the MOSFET is low and the gain and speed of the MOSFET are high. When the channel length is decreased below a certain value $l_0$ indicated in FIG. 3, the threshold voltage ($V_{TH}$) of the surface of the silicon substrate 1 (FIG. 1), when the channel is formed, is decreased as shown by the curve in FIG. 3. When the channel length is less than the $l_0$ mentioned above, the threshold voltage is greatly dependent on the forming accuracy of the N+ type source and drain regions 5 and 6, respectively, which disadvantageously leads to the generation of a large variance in the electrical characteristics of the MOSFETs within a wafer or production lots.

The channel length has, therefore, been adjusted to a value more than the $l_0$ mentioned above, where the threshold voltage is relatively constant. The phenomenon illustrated in FIG. 3 has been studied by researchers and the reason such phenomenon is caused has been proven to be that a lateral electric field in the channel region is greatly influenced by the voltage applied to the N+ type drain region.

SUMMARY OF THE INVENTION

It is an object of the present invention to eliminate the disadvantages of the conventional process for producing semiconductor devices including FETs by a novel utilization process of direct selective nitridation of a semiconductor material followed by a selective oxidation of the semiconductor material.

It is another object of the present invention to provide a process for producing an MISFET, wherein the source and drain regions, and the contact windows of these regions, are formed using a self alignment technique.

It is a further object of the present invention to provide a process for producing an MISFET, wherein the source and drain regions have relatively small dimensions.

It is a yet further object of the present invention to provide a process for producing a semiconductor memory device, wherein a short circuit between the gate of the MISFET and the capacitor gate of a capacitance element of the semiconductor memory device is prevented.

It is still another object of the present invention to provide a process for producing an MISFET, wherein a reduction in the threshold voltage at a short channel length can be prevented.

It is a still further object of the present invention to provide a process for producing an MISFET without the N+ (P+) type drain regions.

In accordance with the objects of the present invention, there is provided a process for producing a semiconductor device comprising the steps of:

selectively forming a silicon nitride film on a silicon semiconductor body by a direct reaction with the nitrogen in a nitrogen-containing atmosphere;

selectively forming, on the silicon nitride film, a covering layer which comprises a member selected from the group consisting of silicon and a metal silicide, and;

exposing the covering layer and the silicon nitride film to a gaseous oxidation medium.

These objects together with other objects and advantages, which will become subsequently apparent, reside in the details of construction and operation as more fully hereinafter described and claimed, reference being had to the accompanying drawings forming a part hereof, wherein like numerals refer to like parts throughout.

BRIEF DESCRIPTION OF THE DRAWINGS

FIG. 5 is a graph illustrating the oxidation tendency of a directly nitrified silicon film and polycrystalline silicon layer;

DETAILED DESCRIPTION OF THE PREFERRED EMBODIMENTS

In FIGS. 4A through 4E, the steps for producing an N channel MISFET, using a silicon body or substrate 1 having a P type conductivity, are illustrated.

Figure 4A:
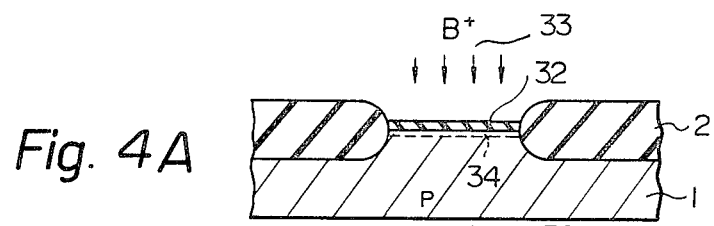
FIGS. 4A through 4E are cross-sectional views of a wafer and illustrate the steps for producing an MISFET in accordance with the present invention.

Referring to FIG. 4A, the field oxide film 2 having a thickness of approximately 8000 Å exposes a part of the silicon substrate 1 and the silicon substrate 1 is selectively nitrified at this exposed part by the direct reaction of the silicon with nitrogen, for example, NH$_3$ gas, at a high temperature, for example, 1200° C. As a result of the direct nitridation reaction, a relatively thin silicon nitride film 32 having a thickness of, for example, 50 Å, is formed on the silicon substrate 1 exposed within the relatively thick field oxide film 2.

It is known from European Laid Open Application No. 0006706 (European Patent Application no. 79301114.9, filed by Fujitsu Limited) to form an insulating film by direct nitridation, in a nitrogen or ammonia atmosphere, of a silicon dioxide film which is formed on a silicon substrate. The nitridation atmosphere according to the European Laid Open Application comprises ammonia (NH$_3$) or hydrazine (N$_2$H$_4$). The nitridation atmosphere may also contain an inert gas, such as argon, and residual gases, such as oxygen. The flow rate of the gas should be from 100 to 50000 cc/minute. The oxidant impurities, such as oxygen, water and carbon dioxide, of the nitridation atmosphere are less than 100 ppm.

The nitrogen atmosphere may comprise a gas plasma of nitrogen-containing gas which may be nitrogen (N$_2$), ammonia (NH$_3$), hydrazine (N$_2$H$_4$), or a mixture thereof. The nitrogen containing gas may be a mixture of one or more of nitrogen, ammonia and hydrazine with one or more of hydrogen (H$_2$), hydrogen chloride (HCl) and halogen gas. The semiconductor silicon body is heated to a temperature of from approximately 800° to approximately 1300° C. within the gas plasma atmosphere, thereby forming the silicon nitride film.

In the present invention, the nitridation atmosphere described in the above mentioned two European Patent Applications can be used.

When control of the impurities at the surface of the silicon substrate is necessary for adjusting the threshold voltage of a transistor, boron ions 33 are ion-implanted after the formation of the silicon nitride film 32, as illustrated in FIG. 4A, or prior to the formation of the silicon nitride film. The region so formed by the ion implementation is indicated in FIG. 4A by reference numeral 34 and is referred to as a channel dope region. The energy and dosing amount of the boron ions for the formation of the channel dope region may be 30 keV and $1 \times 10^{11} \sim 1 \times 10^{14}/cm^2$.

Figure 4B:

Referring to FIG. 4B, a covering layer or polycrystalline silicon layer 35 is deposited on the silicon nitride film 32 to a thickness of approximately 5000 Å and, then, deliniated to a gate electrode pattern of an MISFET. Phosphorus (P+) or arsenic (As+) ions 36 are ion implanted, thereby doping the impurity ions into the polycrystalline silicon layer 35 and the surface portions of the silicon substrate where the source and drain regions are to be formed. The energy and dosing amount of the ions 36 may be 150 keV and $2 \times 10^{15}/cm^2$, respectively.

The wafer treated as stated above is heated within wet oxygen to a temperature of approximately 1000° C., thereby forming a silicon dioxide film 39 (FIG. 4C) on the top surface and the side edges of the polycrystalline silicon layer 35. The thickness of the silicon dioxide film 39 is, for example, approximately 4000 Å.

Figure 4C:
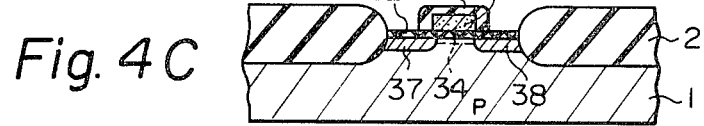

The wet oxygen may be oxygen gas bubbled through water having a temperature of 90° C. When the silicon dioxide film 39 is formed, the phosphous (P+) or arsenic (As+) ions are activated, so that the source region 37 and the drain region 38 are formed as illustrated in FIG. 4C. During the heating step within the oxidation medium, i.e. wet oxygen atmosphere, the exposed silicon nitride film 32 is also oxidized, but to an extent considerably lower than the oxidation of polycrystalline silicon. This will be apparent from FIG. 5, wherein the lines 50 and 51 indicate the oxidized thickness of the phosphorus doped polycrystalline silicon and the silicon nitride film formed by the direct nitridation, respectively. Since the oxide thickness of the silicon nitride film 32 is less than one hundredth of the polycrystalline silicon layer 35, the surface of the silicon substrate 1 is protected from the oxidation. In addition, the silicon nitride film 32 beneath the polycrystalline silicon layer 35 can impede the diffusion of the donor impurities, i.e. the phosphorus and arsenic, into the semiconductor substrate.

Figure 4D:
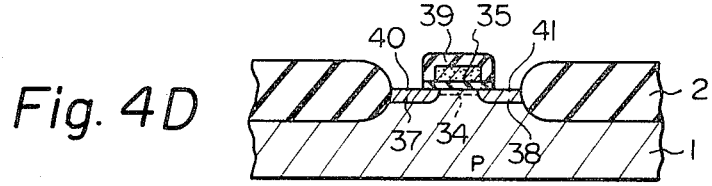

Referring to FIG. 4D, the silicon nitride film 32 on the source and drain regions 37 and 38, respectively, is removed by a solution of a mixture of phosphoric acid and fluoric acid, thereby exposing the surface regions of the silicon substrate 1. In this removal, not a photoresist mask, but the silicon dioxide film 39 is used as a mask for the removal of the silicon nitride film 32, and the silicon dioxide film 39 having a thickness of approximately 3000 Å remains after such removal. The process described hereinabove with reference to FIGS. 4A through 4D is characterized by a simultaneous positioning of the source and drain regions, and windows 40 and 41 of these regions. The source and drain regions 37 and 38, respectively, are formed by ion implantation using the polycrystalline silicon layer 35 of the gate electrode, while the windows 40 and 41 are formed by removal of the silicon nitride film 32, which is partly oxidized to an oxynitride, using the silicon dioxide layer 39 as a mask.

Figure 4E:
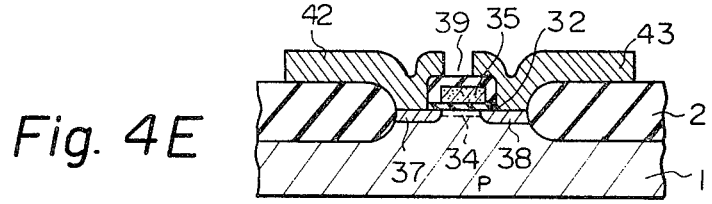

Referring to FIG. 4E, an aluminum layer is deposited by conventional vacuum evaporation on the top surface of the wafer and, then, deliniated to a source electrode 42 and a drain electrode 43. This completes the production of a MISFET.

In the MISFET explained hereinabove, the gate region made of the silicon nitride film by direct thermal nitridation effectively masks against diffused impurities and does not include carrier-trap regions. In addition, the area of the MISFET is reduced by approximately 40% as compared with the conventional short channel MISFET, because of the simultaneous positioning of the windows 40 and 41, and the source and drain regions. Furthermore, it is not necessary to provide the drain region 38 with additional area for preventing the misalignment of the window mask and, therefore, the dimensions of the drain region 38 are smaller than in the conventional MISFET. As a result, the junction capacitance of the drain region is relatively low, and thus, the operational speed of the MISFET is high in the present invention.

Although the source and drain regions 37 and 38, respectively, are formed by ion implantation in the process explained with reference to FIGS. 4A through 4E, conventional gas diffusion may be used, after the removal of the silicon nitride film 32 on the substrate surface where the source and drain regions are to be formed. Furthermore, the doping of the impurities into the polycrystalline silicon layer 35 may be performed during the deposition of the polycrystalline silicon or independently from the formation of the source and drain regions. In addition, instead of silicon, a metal silicide, such as $MoSi_2$, $WSi_2$, $Pd_2Si$, $Ta_2Si$ and $Pt_2Si_5$, can be used for the gate electrode of the MISFET which is produced by a process explained with reference to FIGS. 4A through 4E.

Figure 6:
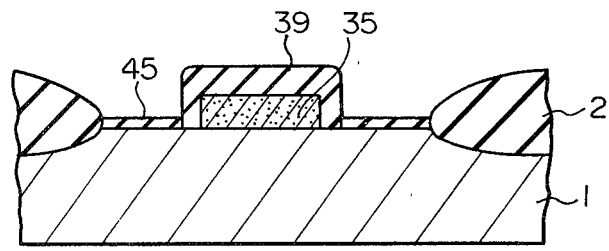
FIG. 6 is a cross-sectional view of a wafer, in which a directly nitrified silicon film is completely oxidized.

Referring to FIG. 6, which illustrates a production step corresponding to the production step of an MISFET illustrated in FIG. 4C, the silicon nitride film formed by the direct nitridation reaction is completely oxidized to form a silicon dioxide film 45, while the thick silicon dioxide film 39 grows on the polycrystalline silicon layer 35. In the succeeding step, the silicon dioxide film 45 can be completely removed while leaving the silicon dioxide film 39 on the polycrystalline silicon layer 35, because the difference in thickness between these silicon dioxide films 39 and 45 is great due to the difference in the oxidation tendency illustrated in FIG. 5.

In FIGS. 7A through 7F, the production steps of a one transistor-one capacitor dynamic memory device are illustrated.

Figure 7A:
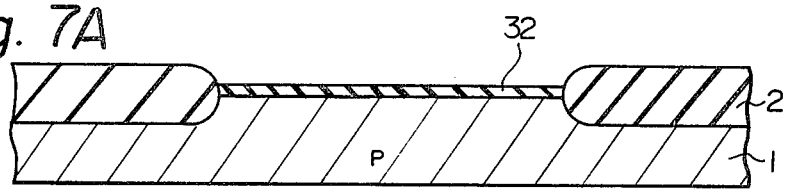
FIGS. 7A through 7F illustrate the steps for producing a semiconductor memory device in accordance with the present invention.

Referring to FIG. 7A, a relatively thin silicon nitride film 32 is formed by direct nitridation on the exposed part of the silicon substrate within the relatively thick field oxide film 2. It is possible to provide the wafer with a structure as illustrated in FIG. 7A by selectively forming the silicon nitride film 32 by direct nitridation and, then, selectively oxidizing the exposed surface of the silicon substrate 1 using the silicon nitride film 32 as a mask, thereby forming the field oxide film 2.

Figure 7B:
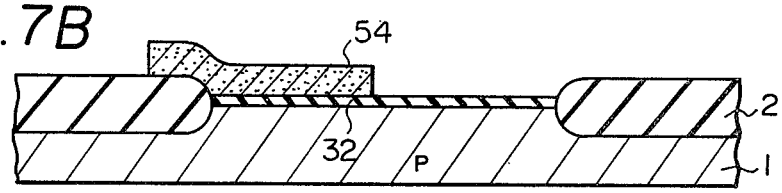
Figure 7C:
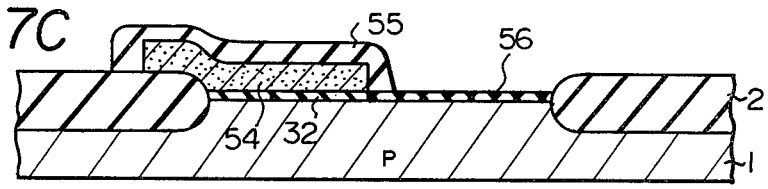

Referring to FIG. 7B, a covering layer or polycrystalline silicon layer having a thickness of, for example, 3000 Å, is deposited and delineated to a pattern of a capacitor gate 54 for storing electrical charges. The wafer so treated is then subjected to oxidation within a wet oxygen atmosphere at a temperature of 1000° C., thereby forming a dioxide film 55 (FIG. 7C) having a thickness of, for example, 2000 Å, on the capacitor gate 54. During the heating in the gaseous oxidation medium, the exposed silicon nitride film 32 is partly oxidized or oxidized to an oxynitride and the thickness of the silicon nitride film 32 is somewhat increased. However, the silicon dioxide film 55 is more than one hundred times thicker than the oxide film (not shown) on the exposed silicon nitride film 32. The silicon nitride film 32, which is partly oxidized and has a reference numeral of 56 in FIG. 7C, can be used for the gate insulating film of the MISFET, but is removed in this embodiment.

Figure 7D:
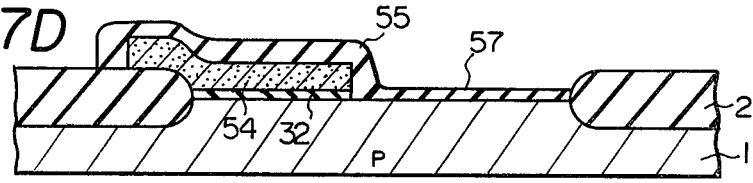
Figure 7E:
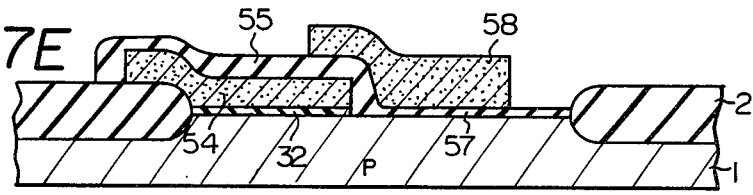

Referring to FIG. 7D, the partly oxidized silicon nitride film 56 is removed by etching and, then, the wafer is heated in a dry oxygen atmosphere at a temperature of 1000° C., so that a silicon dioxide film 57 having a thickness of 700 Å is formed. Subsequently, a polycrystalline silicon layer 58 for the gate electrode of the MISFET is deposited and delineated as illustrated in FIG. 7E. Since the capacitor gate 54 and the gate electrode (58) of the MISFET are insulated from each other by the thick silicon dioxide film 55 having a thickness of 2000 Å or higher, short circuiting of the capacitor gate and gate electrode of the MISFET is prevented. Hence, the production yield of the dynamic memory device becomes high. This is because the thick silicon dioxide film 55 is formed by the preferential oxidation of polycrystalline silicon as compared with oxidation of the silicon nitride formed by direct nitridation.

Figure 7F:
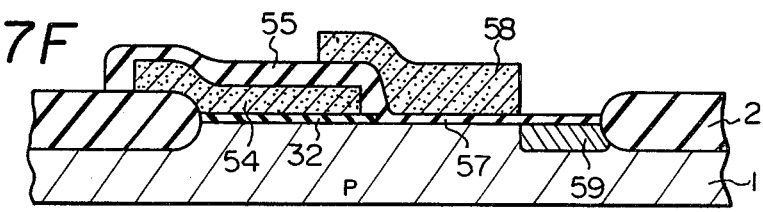

Referring to FIG. 7F, an N+ type layer 59 for a bit line is formed by ion implantation and the production of a one transistor-one capacitor-dynamic memory device is completed. In this memory device, the capacitor element comprises an insulating film made of the silicon nitride formed by direct nitridation, the capacitor electrode 54 and the semiconductor substrate, and the capacitance of the capacitor element can be increased by 50% as compared with the conventional capacitor element using thermally oxidized film as the insulating film. Although the partly oxidized silicon nitride film 56 is removed in the step shown in FIG. 7D, the partly oxidized silicon nitride film 56 having a masking effect against oxidation and the diffusion of impurities can be used, in the process of the present invention, as the gate insulating film of the MISFET.

Referring to FIGS. 8A through 8E, a metal-semiconductor contact or a Schottky contact is formed by a process of the present invention comprising the step of depositing a member selected from a group consisting of a metal and a semiconductor element heavily doped with impurities on a silicon layer which is exposed by selective removal of a silicon nitride film.

Figure 8A:
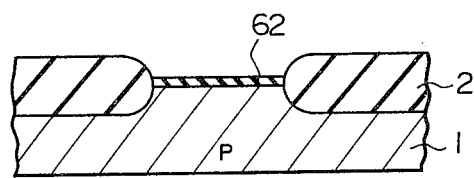
FIGS. 8A through 8E are cross-sectional views illustrating the steps for producing an MISFET with the Schottky barrier source and drain regions in accordance with the present invention.
Figure 8B:
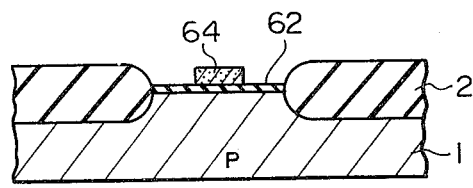
Figure 8C:
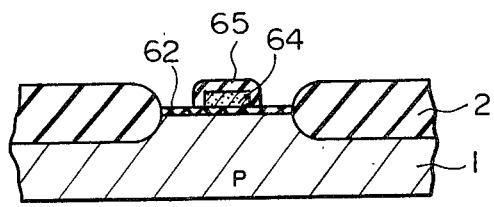

Referring to FIG. 8A, a silicon nitride film 62 having a thickness of approximately 100 Å is formed on the exposed part of the silicon substrate 1 within the field oxide film 2 having a thickness of approximately 1 micron. The silicon nitride film 62 is formed by direct nitridation, e.g. heating the wafer in an NH$_3$ gas, at 1100° C., for 1 hour. Referring to FIG. 8B a metal silicide, such as MoSi$_2$, or a polycrystalline silicon, which is doped with impurities is deposited to a thickness of approximately 4000 Å and, then, is delineated to a gate electrode 64. The wafer is then subjected to oxidation under a wet oxygen atmosphere at a temperature of 900° C., thereby forming a silicon dioxide film 65 (FIG. 8C) around the gate electrode 64. The silicon substrate 1 beneath the silicon nitride film 62 is protected from the oxidation due to the masking effect of the silicon nitride film 62.

Figure 8D:
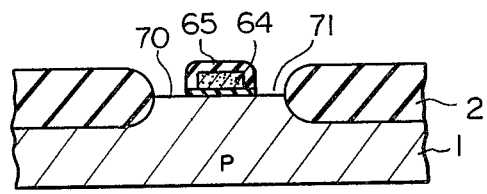

Referring to FIG. 8D, the exposed silicon nitride film 62 is removed by etching with a buffer solution containing hydrofluoric acid, a plasma dry etchant, such as a plasma gas of CF$_4$ and O$_2$, or a reactive sputter etching. As a result of etching, parts 70 and 71 of the silicon substrate are exposed, but the silicon dioxide layer 65 partly remains.

Figure 8E:
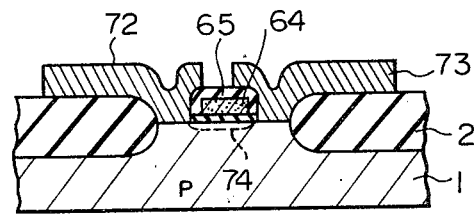

An electrode material is deposited over the top surface of the wafer treated as described above and, then, is delineated as a source electrode 72 and a gate electrode 73 (FIG. 8E). Since the MISFET produced is an N channel type, ziroconium is desirable as the electrode material. A conventional electrode material, such as aluminum, may be deposited on the zirconium source and drain electrodes.

In the MISFET produced as described above, the source and drain electrodes 72 and 73, respectively, are in nonohmic contact or Schottky contact with the P type silicon substrate 1, and are in ohmic contact with a channel 74 (FIG. 8E) having N type conductivity. The source and drain electrodes 72 and 73, respectively, are isolated from the gate electrode 64 by the silicon dioxide film 65 having a thickness of approximately 2000 Å. This thickness of 2000 Å is equal to or less than the thickness of a built-in depletion layer, which is generated at the Schottky contact due to the difference in the work functions between the silicon substrate and the source and drain electrodes, and therefore, satisfactory conductivity between the source and drain regions can be realized.

Figure 1:
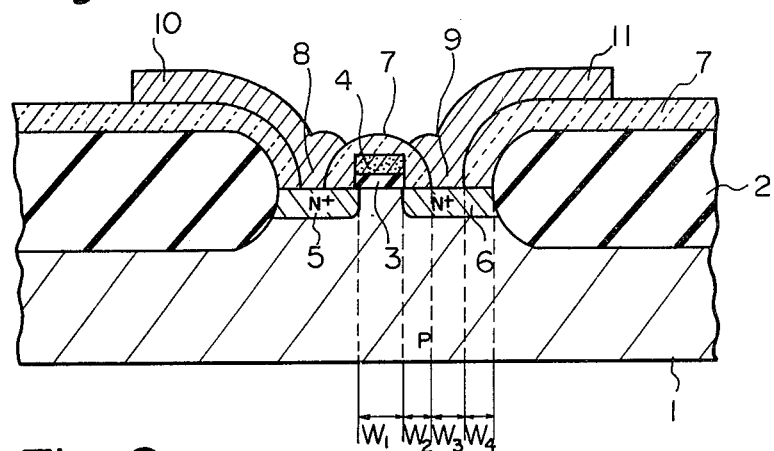
FIG. 1 is a cross-sectional view of the structure of a prior art FET.
Figure 3:
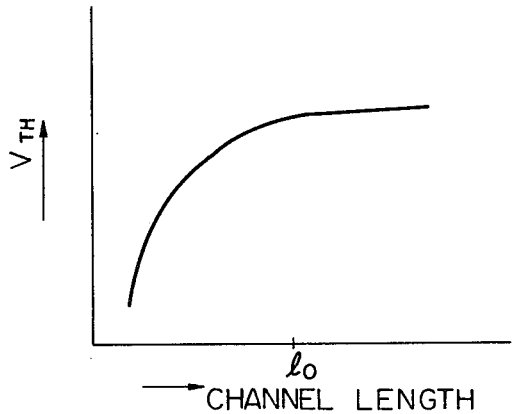
FIG. 3 is a graph illustrating the channel length versus the threshold voltage for the semiconductor device of FIG 1

Since the N+ type source and drain regions 5 and 6 (FIG. 1), respectively, of the MISFET are not formed in the MISFET illustrated in FIG.. 8B and having the Schottky contact, the reduction of the threshold voltage (V$_{TH}$) due to a short channel (c.f. FIG. 3) does not occur in the MISFET having the Schottky contact. Therefore, the effective channel length of this MISFET is as short as 1 micron or less. In addition, the position of source and drain electrodes 72 and 73, respectively, is determined by self alignment with the gate electrode 64. It is, therefore, unnecessary to provide the exposed parts 70 and 71 of the silicon substrate 1 with additional dimensions to compensate for the misalignment of a mask for forming the source and drain regions.

In the MISFET having the Schottky contacts, instead of the silicon nitride film formed by direct nitridation, a CVD silicon nitride film may be used for the insulating film of the gate of the MISFET. Such a CVD silicon nitride film must, however, be formed on a thermally oxidized silicon dioxide film, so that a double layer gate insulating film structure is provided. It is, however, difficult to provide such an insulating film with stable electrical properties and a small thickness.

Figure 2:
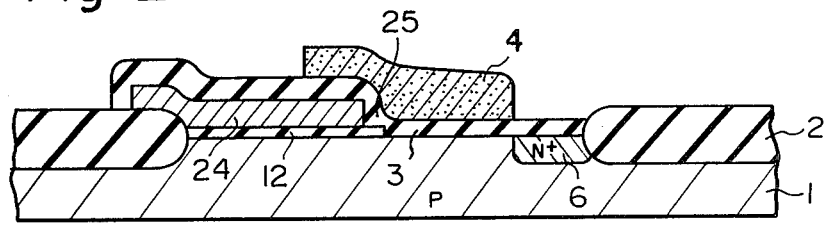
FIG. 2 is a cross-sectional view of the structure of a prior art semiconductor memory device including a MOSFET.

The process for formation of the Schottky contact described hereinabove can be utilized for the formation of the bit line contact of a dynamic memory device as such as the one illustrated in FIG. 2. Obviously, the N+ type layer 6 (FIG. 2) is omitted when the Schottky contact is formed at the bit line of the transferring FET of the dynamic memory device.

Figure 9:
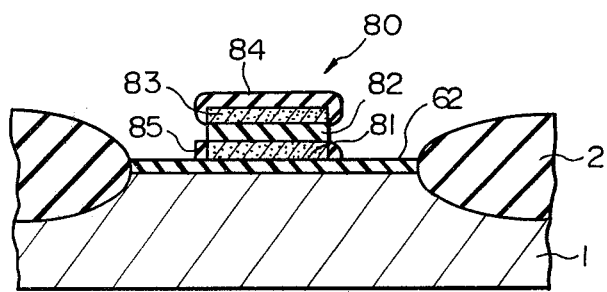
FIG. 9 is a cross-sectional view of a stacked gate MISFET in accordance with the present invention.

Referring to FIG. 9, a production step for a stacked gate MOS is illustrated. The field oxide film 2 and the silicon nitride film 62 are formed as described with reference to FIGS. 4A, 7A and 8A. Subsequently, a multi-covering layer 80 is formed by successively depositing, on a selected portion of the silicon nitride film 62, three layers 81, 82 and 83. The first layer 81 comprises a polycrystalline silicon or a metal silicide and has a thickness of, for example, 3000 Å. The second layer 82 comprises an insulating material, and preferably silicon dioxide, silicon nitride and the oxide or nitride of a metal silicide, and has a thickness of, for example, 1000 Å. The third layer 83 comprises silicon or a metal silicide and has a thickness of, for example, 3000 Å. The wafer including the multi-layer covering 80 is subjected to the oxidation described with reference to FIGS. 4C, 7C and 8C, and then, to the removal of the exposed silicon nitride film 62 described with reference to FIGS. 4D, 7D and 8D. The reference numerals 84 and 85 indicate silicon dioxide films. The source and drain regions (not shown) are then formed on the exposed silicon substrate 1, followed by the formation of the source and drain electrodes. The so produced stacked gate MOS has an advantageously small size due to self alignment of the gate electrode with the source and drain regions.

In FIGS. 10A through 10G, production steps of a dynamic memory device different from that in FIGS. 7A through 7F are illustrated.

Figure 10A:
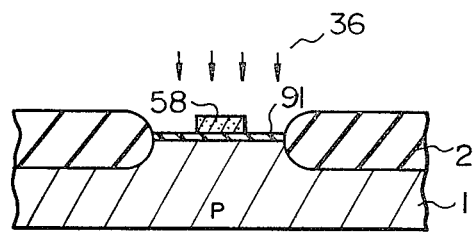
FIGS. 10A through 10G are cross-sectional views illustrating the the steps for producing a semiconductor memory device.
Figure 10B:
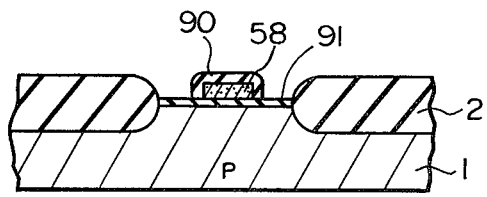
Figure 10C:
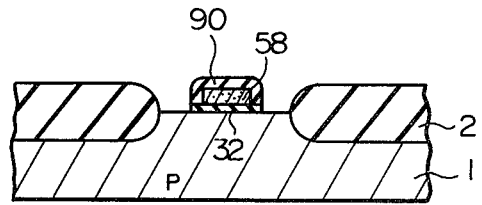
Figure 10D:
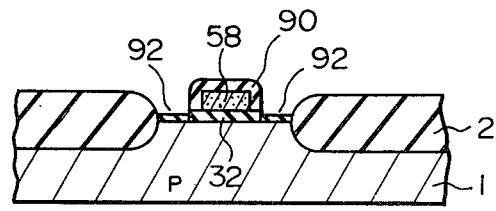
Figure 10E:
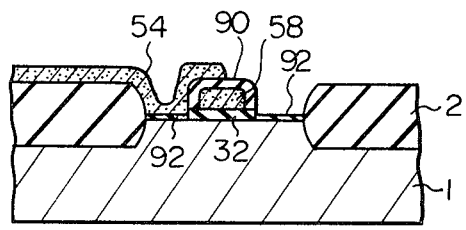
Figure 10F:
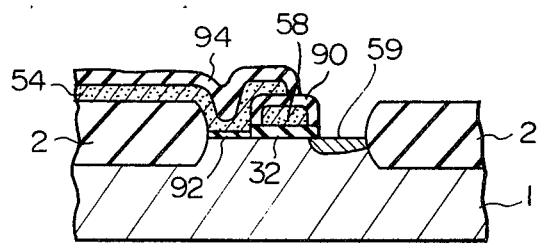
Figure 10G:
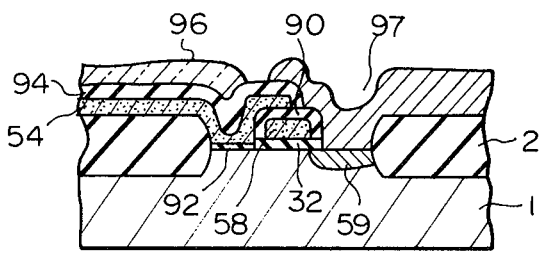

Referring to FIG. 10A, arsenic or phosphorus ions 36 are implanted on the polycrystalline silicon layer 58 which is delineated to the pattern of the gate electrode of an MISFET, i.e. the single transistor of the one transistor-one capacitor dynamic memory cell. The wafer is subjected to oxidation, thereby forming a silicon dioxide film 90 (FIG. 10B) on the polycrystalline silicon layer 58. An oxide layer formed on a silicon nitride film 91 formed by the direct nitridation is very thin. The exposed silicon nitride film 91 is removed using the silicon dioxide film 90 (FIG. 10C) as a mask. The thus exposed silicon substrate 1 is subjected to direct nitridation, thereby forming a silicon nitride film 92 as illustrated in FIG. 10D. The capacitor electrode 54, made of polycrystalline silicon, is deposited as illustrated in FIG. 10E and is subsequently subjected to oxidation. As a result of the oxidation, a silicon dioxide film 94 (FIG. 10F) is formed. Using the silicon dioxide films 90 and 94 as masks, the exposed silicon nitride film 32 is removed and then the N+ type layer 59 (FIG. 10F) of a bit line is formed by ion implantation or diffusion. A bit line 97 and a phosphosilicate glass (PSG) layer 96 are finally formed as illustrated in FIG. 10G. Instead of removing the exposed silicon nitride film 91, such film, which is partly oxidized or converted to an oxynitride, may not be removed and may be used as the insulating film 92 of the capacitor element.

An advantage of the process illustrated in FIGS. 10A through 10G over that in FIGS. 7A through 7F is that the channel length of the MISFET is initially determined. The size of the memory device illustrated in FIG. 10G is, therefore, smaller than that illustrated in FIG. 7F, because a size increase due to misalignment of the gate electrode pattern does not occur in the production of the former memory device.

It will be understood from the explanation hereinabove with reference to FIGS. 4 through 10, that the basic concept of the present invention, i.e. utilizing the excellent oxidation resistance of the silicon nitride film formed by the direct nitridation as well as the great oxidation tendency of the covering layer made of, for example, polycrystalline silicon and selectively formed on the silicon nitride film, can be embodied as various processes for the production of semiconductor devices. In addition, although for the sake of brevity combinations of the techniques used in the embodiments illustrated in FIGS. 4 through 10 have not been described, it will be obvious that, in the production of semiconductor devices, it is possible to optionally combine such techniques as: ion implantation through the silicon nitride film into the semiconductor substrate; ion implantation directly into the semiconductor substrate; diffusion of impurities into the semiconductor substrate; selective removal of the silicon nitride using the silicon dioxide film as a mask; formation of field insulation film by selective oxidation using the silicon nitride film; removal of the relatively thin, completely oxidized silicon nitride film and leaving the relatively thick silicon dioxide film; and using the partly or completely oxidized silicon nitride film as the gate insulating film of the MISFET or of the capacitor element. The basic concept mentioned above can be advantageously embodied, as understood from the explanation above, as a process comprising the steps of: selectively covering a semiconductor substrate with a relatively thick field insulation film; forming on the exposed part of the semiconductor substrate a relatively thin nitride film by direct nitridation; and; selectively forming a film of a silicon or a metal silicide on the silicon nitride film, thereby producing a capacitor comprising the silicon or silicide film, the silicon nitride film and the semiconductor substrate. The capacitor may be for storing information. The so produced semiconductor memory device is practically valuable as a high capacitance memory device and a highly integrated logic element.

We claim:

1. A process for producing a semiconductor device comprising the steps of:
   selectively forming a silicon nitride film on a silicon semiconductor body by a direct reaction with nitrogen in a nitrogen-containing atmosphere;
   selectively forming a covering layer on said silicon nitride film the covering layer comprising one of silicon and a metal silicide; and
   exposing said covering layer and said silicon nitride film to a gaseous oxidation medium.

2. A process according to claim 1, further comprising the step of:
   selectively removing said silicon nitride film using, as a mask, an oxide film formed on said covering layer during said step of exposing said covering layer to the gaseous oxidation medium.

3. A process according to claim 1, wherein said exposing step comprises converting the exposed part of said silicon nitride film to silicon dioxide.

4. A process according to claim 3, further comprising the step of:
   removing said oxidized silicon nitride film while leaving the oxide film formed on said covering layer during said exposing step.

5. A process according to claim 2 or 4, further comprising the step of:
   introducing impurities into at least one part of said silicon semiconductor body exposed by the selective removal of the silicon nitride film.

6. A process according to claim 5, wherein said impurity introducing step comprises forming source and drain regions of an MISFET.

7. A process according to claim 5, wherein said impurity introducing step comprises forming a bit line of a one transistor-one capacitor dynamic memory cell.

8. A process according to claim 2 or 4, further comprising the step of:
   ion-implanting impurities into said covering layer and into at least one part of said silicon semiconductor body through the exposed silicon nitride film prior to said exposing step.

9. A process according to claim 8, wherein the step of ion-implanting into at least one part of said silicon semiconductor body comprises forming source and drain regions of an MISFET.

10. A process according to claim 8, wherein the step of ion-implanting into at least one part of said silicon semiconductor body comprises forming a bit line of a one transistor-one capacitor dynamic memory cell.

11. A process for producing a semiconductor device comprising the steps of:
    selectively forming a silicon nitride film on a silicon semiconductor body by a direct reaction of the silicon in said silicon semiconductor body with nitrogen;
    selectively oxidizing said silicon semiconductor body using said silicon nitride film as a mask;
    selectively forming a covering layer on said silicon nitride film, said covering layer comprising one of silicon and a metal silicide; and
    exposing said covering layer and said silicon nitride film to a gaseous oxidation medium.

12. A process according to claim 11, wherein said selective oxidizing step comprises forming a field oxidation film.

13. A process according to claim 12, further comprising the step of:
    selectively removing said silicon nitride film using an oxide film formed on said covering layer during said exposing step as a mask.

14. A process according to claim 11, wherein said exposing step comprises converting the exposed part of said silicon nitride film to silicon dioxide.

15. A process according to claim 14, further comprising the step of:
    removing the oxidized silicon nitride film, while leaving the oxide film formed on said covering layer during said exposing step.

16. A process according to claim 13 or 15, further comprising introducing impurities into at least one part of said semiconductor body exposed by the selective removal of the silicon nitride film.

17. A process according to claim 16, wherein said impurity introducing step comprises forming source and drain regions of an MISFET.

18. A process according to claim 16, wherein said impurity introducing step comprising forming a bit line of a one transistor-one capacitor dynamic memory cell.

19. A process according to claim 13 or 15, comprising the step of:
    ion-implanting impurities into said covering layer and into at least one part of said silicon semiconductor body through the exposed silicon nitride film prior to said exposing step.

20. A process according to claim 19, wherein the step of ion-implanting into at least one part of said silicon semiconductor body comprises forming source and drain regions of an MISFET.

21. A process according to claim 19, wherein the step of ion-implanting into at least one part of said silicon semiconductor body comprises forming a bit line of a one transistor-one capacitor dynamic memory cell.

22. A process for producing a semiconductor device comprising the steps of:
  selectively forming a silicon nitride flm on a silicon semiconductor body by a direct reaction with nitrogen in a nitrogen-containing atmosphere;
  selectively forming a covering layer on said silicon nitride film, the covering layer comprising one of silicon and a metal silicide;
  exposing said covering layer and said silicon nitride film to a gaseous oxidation medium;
  removing said silicon nitride film, using an oxide film formed on said covering layer during said exposing step as a mask; and
  depositing on said silicon semiconductor body one of a metal and a semiconductor material heavily doped with impurities, thereby forming a Schottky contact between said silicon semiconductor body and said one of the metal and the semiconductor material heavily doped with impurities.

23. A process for producing a semiconductor device comprising the steps of:
  selectively forming a silicon nitride film on a silicon semiconductor body by a direct reaction of the silicon of said silicon semiconductor body with nitrogen;
  forming a multi-covering layer by successively forming, on a selected portion of said silicon nitride film, a first layer comprising one of silicon and a metal silicide, a second layer comprising an insulating material, and a third layer comprising one of silicon or metal silicide; and
  exposing said multi-covering layer and said silicon nitride film to a gaseous oxidation medium.

24. A process according to claim 23, further comprising the step of:
  selectively removing said silicon nitride film, using an oxide film formed on said multi-layer covering during said exposing step as a mask; and
  introducing impurities into the portions of the silicon semiconductor body exposed by the selective removal of the silicon nitride film.

25. A process according to claim 24, wherein the step of introducing impurities into said silicon semiconductor body comprises forming source and drain regions of a stacked gate MISFET.

26. A process for producing a semiconductor device comprising a one transistor-one capacitor memory cell, said process comprising the steps of:
  selectively forming a silicon nitride film on a silicon semiconductor body by a direct reaction with nitrogen in a nitrogen-containing atmosphere;
  forming a gate electrode of the one transistor on a selected part of said silicon semiconductor body;
  exposing the surface of said gate electrode and the silicon nitride film to a gaseous oxidation medium; and
  forming the one capacitor on a portion of said silicon semiconductor body not covered by said gate electrode.

27. A process according to claim 26, further comprising the steps of:
  removing the silicon nitride film exposed to the gaseous oxidation medium during the exposing step, thereby exposing the silicon semiconductor body; and
  forming an oxide film on the portions of the silicon semiconductor body exposed in the removing step.

* * * * *

UNITED STATES PATENT AND TRADEMARK OFFICE
CERTIFICATE OF CORRECTION

PATENT NO. : 4,343,657
DATED : AUGUST 10, 1982
INVENTOR(S) : TAKASHI ITO ET AL.

It is certified that error appears in the above-identified patent and that said Letters Patent is hereby corrected as shown below:

Column 2, line 68, "silicide, and;" should be --silicide; and--.
Column 3, line 15, "inclusing" should be --including--;
line 19, after "1" insert --;--;
line 36, "," should be --;--;
line 38, delete "the" (first occurrence);
line 57, "no." should be --No.--.
Column 4, line 7, after "and" insert --a--;
line 12, delete "two";
line 13, "Applications" should be --Application--;
line 19, delete "imple-";
line 20, "mentation" should be --implantation--;
line 28, "deliniated" should be --delineated--.
Column 5, line 14, "deliniated" should be --delineated--;
line 37, after "32" insert --,--.
Column 7, line 68, delete "as".
Column 9, line 33, "nitridation; and;" should be --nitridation; and--.
Column 10, line 61, "comprising" should be --comprises--.

Signed and Sealed this

Fourth Day of January 1983

[SEAL]

Attest:

GERALD J. MOSSINGHOFF

Attesting Officer  Commissioner of Patents and Trademarks